(12) United States Patent
Takikawa et al.

(10) Patent No.: US 6,624,509 B2
(45) Date of Patent: Sep. 23, 2003

(54) SEMICONDUCTOR DEVICE

(75) Inventors: Kumiko Takikawa, Tama (JP); Satoshi Tanaka, Kokubunji (JP); Satoshi Kayama, Hamura (JP); Yuichi Saito, Takasaki (JP); Norio Hayashi, Tamamura (JP)

(73) Assignees: Hitachi, Ltd., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 09/911,796

(22) Filed: Jul. 25, 2001

(65) Prior Publication Data
US 2002/0053729 A1 May 9, 2002

(30) Foreign Application Priority Data

Aug. 30, 2000 (JP) .......................................... 2000-265982

(51) Int. Cl.⁷ .............................................. H01L 23/48
(52) U.S. Cl. ....................... 257/692; 257/690; 257/691; 257/697
(58) Field of Search .................... 257/690, 691, 257/692, 697, 536, 537, 538, 678, 701, 694, 693, 695, 696, 728; 455/142, 143, 144, 146

(56) References Cited

U.S. PATENT DOCUMENTS 6,407,449 B1 * 6/2002 Takikawa et al. ........... 257/690
2001/0015676 A1 * 8/2001 Takikawa et al. ........... 330/307
2002/0079569 A1 * 6/2002 Takikawa et al. ........... 257/690

OTHER PUBLICATIONS

ISSCC 2000, pp. 144, 145 & 451.

Data Sheet, IF amplifier TDA8011T, Feb. 1995.

Data Sheet, Bipolar Analog Intefrated Circuit μPC2726T, 1994.

U.S. patent application Ser. No. 09/547,915, "Semiconductor Integrated Circuit", filed Apr. 11, 2000.

* cited by examiner

Primary Examiner—Nathan J. Flynn
Assistant Examiner—Fazli Erdem
(74) Attorney, Agent, or Firm—Antonelli, Terry, Stout & Kraus, LLP

(57) ABSTRACT

In a differential low-noise amplifier built in a semiconductor integrated circuit for a dual-band wireless transceiver, impedance components of wire bonding and package that occur in emitters are reduced and a gain is improved. Ground pins of amplifiers of the differential amplifier forming a pair are arranged adjacent to each other. Input pins and ground pins of the same amplifier are arranged adjacent to each other. Signals of the adjacent pins are allowed to have inverse phases, and trans-coupling between the pins is utilized so as to reduce impedance of the transistor emitters.

20 Claims, 6 Drawing Sheets

$$Gm = \frac{ic}{vi} = \frac{gm}{1+gmZe} \quad \cdots \cdots 601$$

$$(Ze = j\omega L)$$

SEMICONDUCTOR DEVICE

BACKGROUND OF THE INVENTION

This invention relates to a transceiver semiconductor device primarily used for wireless communication.

This invention also relates to U.S. Ser. No. 09/547,915 filed Apr. 11, 2001, entitled "SEMICONDUCTOR INTEGRATED CIRCUIT".

FIG. 5 of the accompanying drawings shows a structural example of terminal equipment to which a semiconductor integrated circuit for a dual-band wireless transceiver having a built-in differential low-noise amplifier (hereinafter called "transceiver IC") is applied.

The transceiver IC 501 is fabricated by incorporating a circuit of a dual-band high frequency part together with a frequency conversion circuit into one chip. The IC is connected to a base band IC 515 of a subsequent stage. The base band IC executes A/D and D/A conversion of signals, and executes also digital signal processing. The transceiver part of the transceiver IC 501 is formed of a low-frequency band differential low-noise amplifier 502a and a low-frequency band reception mixer 503a, a high-frequency band differential low-noise amplifier 502b, a high-frequency band reception mixer 503b, a low-pass filter 504, a variable-gain amplifier 505, a modulator 507 and an offset PLL 508. A high-frequency synthesizer 509, a local oscillator 510 provided outside the IC and a divider supply a high-frequency local oscillation signal necessary for frequency conversion. Similarly, a low-frequency synthesizer 512, a local oscillator 513 and a divider 514 supply a low-frequency local oscillation signal. Since the low-frequency amplifier has a differential construction, single-differential conversion that has been executed by use of a transformer as an external component is not necessary. Therefore, the number of external components can be reduced.

The differential low-noise amplifier comprises two unit amplifiers having the same construction, and conducts differential amplification by inputting two high-frequency signals having mutually inverse phases.

An example of the transceiver IC having a built-in differential low-noise amplifier is described in "A RF Transceiver for Digital Wireless Communication in a 25 GHz Bipolar Technology" reported by Infineon Co. in ISSCC2000, pp. 144–145 & 451. This report describes a transceiver IC for DECT (Digital Enhanced Cordless Telecommunication). The low-noise amplifier of the reception system has a differential construction, but signal lines, ground lines, pin arrangement, and so forth, are not known. The package used is of a TSSOP38 pin type.

A typical example of the amplifier in which only the differential amplifier is constituted into an IC is an IF band gain control amplifier, TDA8011T for a satellite TV receiver, a product of Philips Co. (see DATA SHEET, February, 1995). The circuit has a differential construction, inputs signals from package pins IF11 and IF12 and outputs them from IFO1 and IFO2. A ground pin is one pin. Another example is a 1.6 GHz band differential broadband amplifier, $\mu$PC2726T, a product of NEC. FIG. 8 shows the pin arrangement and the circuit diagram. The circuit inputs signals from in1 and in2 and outputs them from out1 and out2.

However, IC manufacturers other than those described above have not produced a differential amplifier each of the unit amplifiers of which has a ground pin.

SUMMARY OF THE INVENTION

It is an object of the present invention to improve a gain of an amplifier having a differential construction such as a low-noise amplifier.

Next, the causes that invite the drop of the gain of a high-frequency amplifier will be described with reference to FIG. 6. FIG. 6 is an equivalent circuit diagram representing mutual conductance Gm when an amplifier IC chip is mounted to a package. A transistor 601 is a transistor dedicated to the amplifier main body. A high-frequency signal is inputted from a base of 602. A collector current ic flows when a suitable bias voltage is applied. Impedance Ze due to a bonding wire and a pin adds to the emitter of the transistor 601. This impedance lowers overall mutual conductance Gm of the amplifier much more than mutual conductance gm of the transistor 601 as represented by equation 601 shown in FIG. 6. Therefore, the number of ground pins is increased and Ze is connected in parallel in an amplifier calling for a high gain. In this way, the inductance component of the bonding wire and the pin can be reduced.

TABLE 1

| | Pin Arrangement | Inductance Relation with respect to Ground Pin | Equivalent Circuit | Total Inductance |
|---|---|---|---|---|
| a. | Ground Pins of One Amplifier Being Adjacent to Each Other 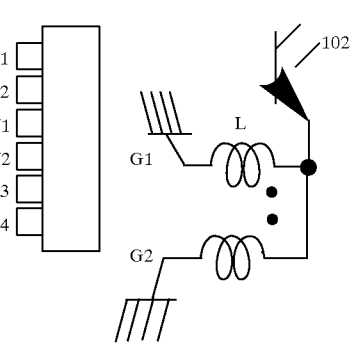 | 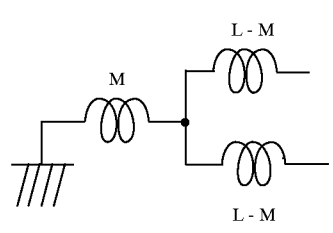 | | $\dfrac{L+M}{2}$ |

TABLE 1-continued

| Pin Arrangement | Inductance Relation with respect to Ground Pin | Equivalent Circuit | Total Inductance |
|---|---|---|---|
| b. Ground Pins of Amplifiers Forming Pair Being Adjacent to Each Other | 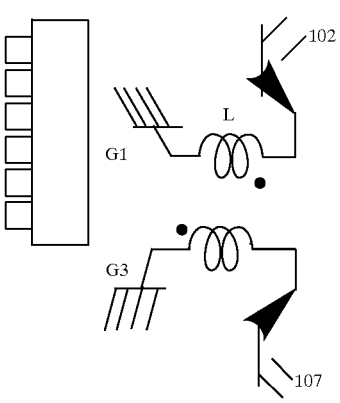 | 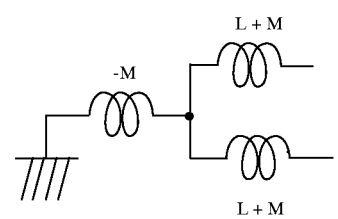 | $\dfrac{L-M}{2}$ |

TABLE 1 shows the pin arrangement of a package, an equivalent circuit and an inductance component when an amplifier has two lead pins (hereinafter called "ground pins") to be connected to a power supply line of a unit amplifier. The upper column of TABLE 1 represents the case where the ground pins of the first unit amplifier 101 shown in FIG. 1A are arranged adjacent to each other. Explanation about a circuit using a concrete circuit will be explained in a later-appearing embodiment. An input pin IN1 and ground pins G1 and G2 are pins of the first unit amplifier 101. Pins IN2, G3 and G4 are pins of the second unit amplifier 106 that forms a pair with the unit amplifier 101. Symbol L represents inductance due to the bonding wire and the pins. Since the gap between the pins of the IC is extremely small, trans-coupling exists between the pins, and is expressed by mutual conductance M. In this pin arrangement, the voltages of the adjacent ground pins have the same phase. As is obvious from TABLE 1, therefore, the inductance does not drop to the half even when the ground pin is two pins. The inductance is generally about 70% in comparison with the single pin.

Next, the construction in which the ground of the unit amplifier has a one-pin structure will be explained. FIG. 1B shows the circuit. In this construction, the ground pins of the unit amplifiers 101 and 106 shown in FIG. 1A change to only G1 and G3. In the circuit shown in FIG. 1B, a collector current increases when a positive voltage is inputted to the base of a transistor 102 of the first unit amplifier 101 and the voltage drops through a load resistor 105. In consequence, the collector voltage drops and the input signal and the output signal have an inverse phase relation. This also holds true of the second unit amplifier 106. Since the input signal has the inverse phase, however, the circuit operations of 101 and 106 have the inverse phase to each other.

TABLE 2

| | Pin Arrangement | Inductance Relation with Respect to Ground Pin | Impedance of Emitter of Transistor |
|---|---|---|---|
| a. Input Pins and Ground Pins of Amplifiers Forming Pair Being Adjacent to Each Other | | 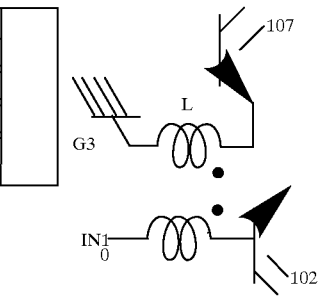 | $\sqrt{\dfrac{M^2 - \omega^2(L^2 - M^2 gm^2)}{(L-M)^2 gm^2}}$ |

TABLE 2-continued

| Pin Arrangement | | Inductance Relation with Respect to Ground Pin | Impedance of Emitter of Transistor |
|---|---|---|---|
| b. Input Pin and Grand Pin of One Amplifier Being Adjacent to Each Other | 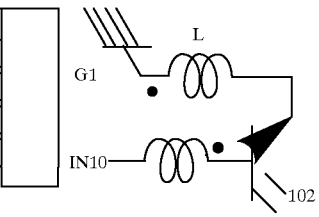 | | $\sqrt{\dfrac{M^2 - \omega^2(L^2 - M^2 gm^2)}{(L+M)^2 gm^2}}$ |

TABLE 2 tabulates the pin arrangement of the package and the emitter impedance of the transistor when the ground pin of the unit amplifier is only one. The upper column of this table represents the case where the ground pin G1 of the first unit amplifier 101 shown in FIG. 1b and the input pin IN2 of the second unit amplifier 106 are arranged adjacent to each other. In this case, the pins have the same phase. Therefore, the impedance developing in the emitter of the transistor becomes greater and overall Gm of the amplifier decreases with the drop of the gain.

According to one aspect of the present invention, in a differential amplifier having two lead pins (hereinafter called the "ground pins") connected to a power supply of a unit amplifier, the ground pins of the first unit amplifier are arranged adjacent to the ground pins of the second unit amplifier on the 1:1 basis in order to improve the gain of the amplifier. The lower column of TABLE 1 illustrates an example of the pin arrangement in one embodiment of the present invention. In this case, the adjacent pin voltages have inverse phases due to the differential signals. As expressed by the equivalent circuit in TABLE 1, the total inductance can be reduced to below the half of the bonding wire and pin inductance.

According to another aspect of the present invention, when the ground pin of the unit amplifier is one pin, lead pins connected to input lines (hereinafter called the "input pins") are arranged adjacent to each other in order to improve the gain of the amplifier.

The lower column of TABLE 2 illustrates an example of the pin arrangement in one embodiment of the present invention. As can be appreciated clearly by comparing the impedance formulas of the upper and lower columns of this table, the signals have the inverse phases when the input pin and the ground pin of the same amplifier are arranged adjacent to each other, so that the impedance developing in the emitter of the transistor is smaller.

DESCRIPTION OF THE EMBODIMENTS

Figure 1A:
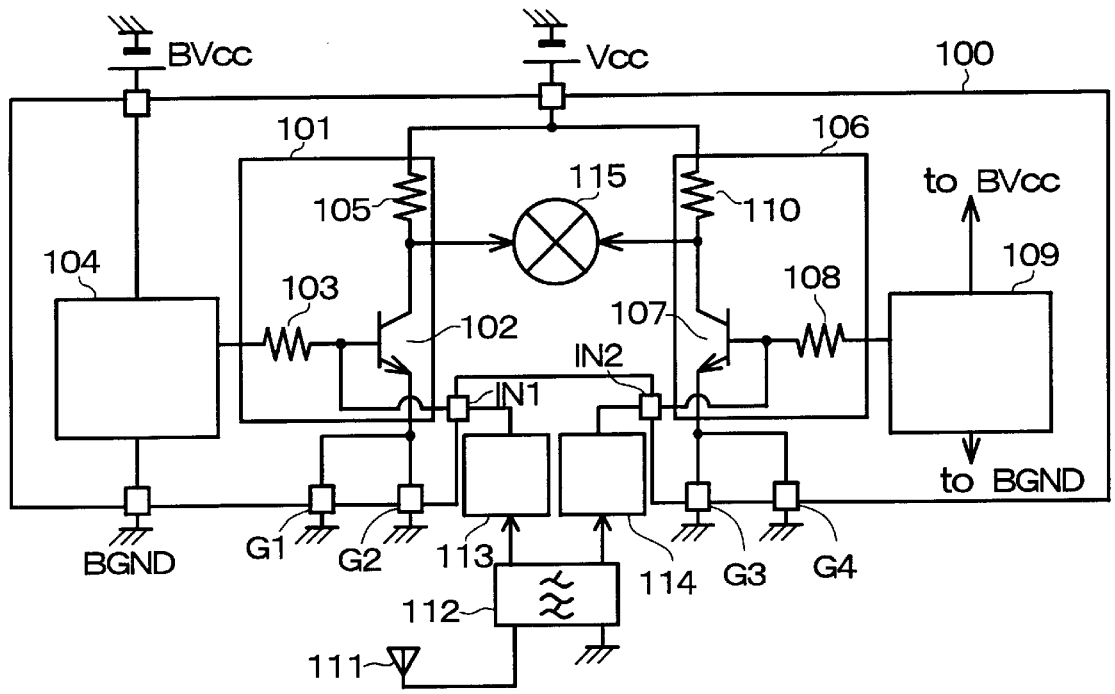
FIGS. 1A and 1B are circuit diagrams of an embodiment of the present invention.
Figure 1B:
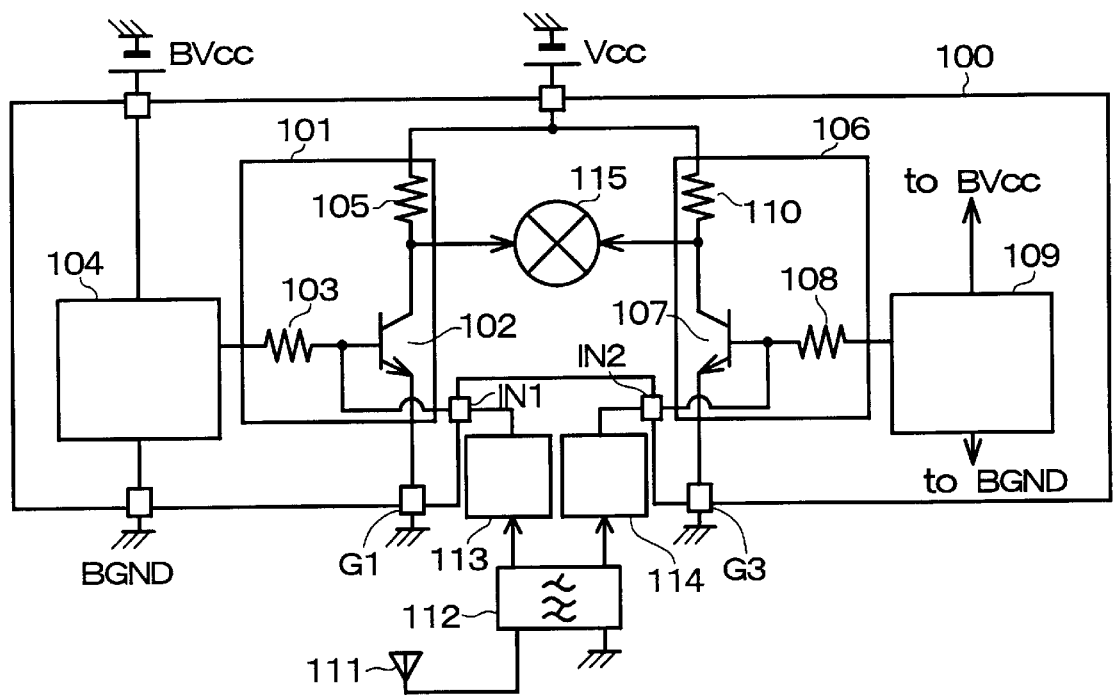
Figure 5:
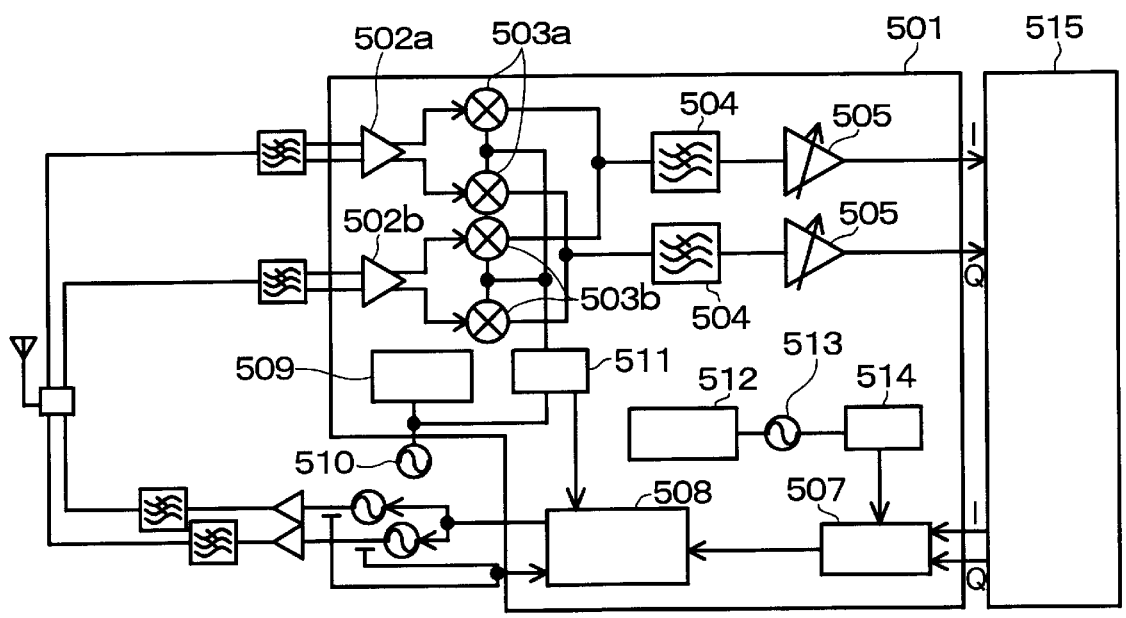
FIG. 5 shows a construction of a semiconductor integrated circuit for a dual-band wireless transceiver.
Figure 6:
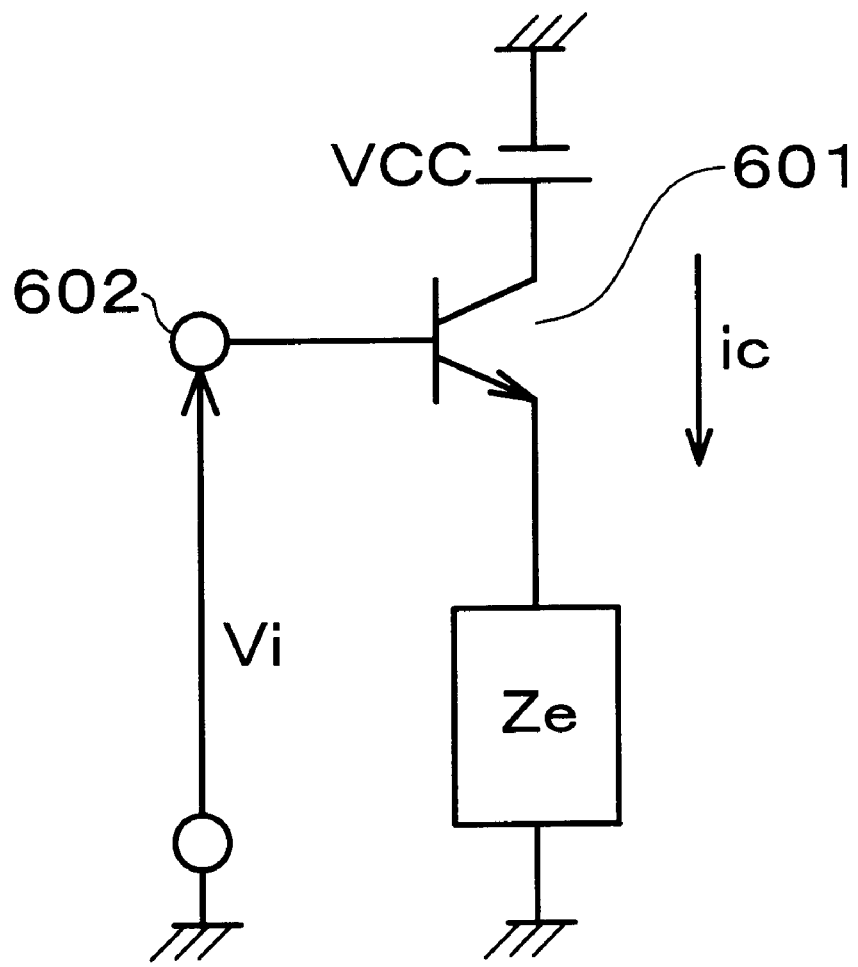
FIG. 6 shows an equivalent circuit representing mutual conductance of an amplifier.
Figure 7:
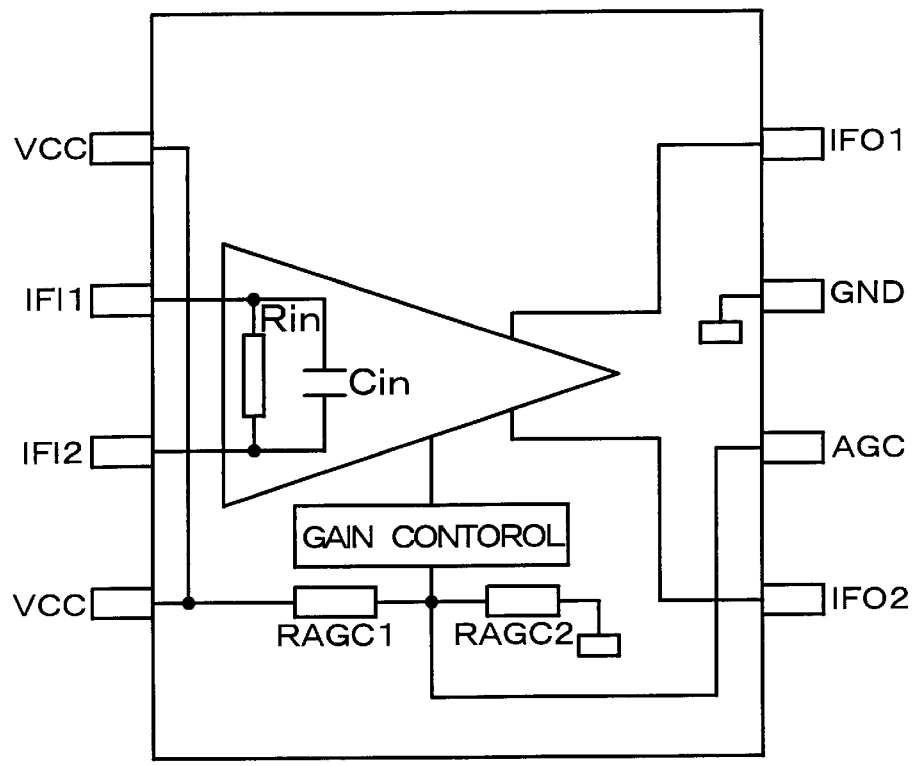
FIG. 7 shows a pin arrangement of TDA8011T of Philips.
Figure 8:
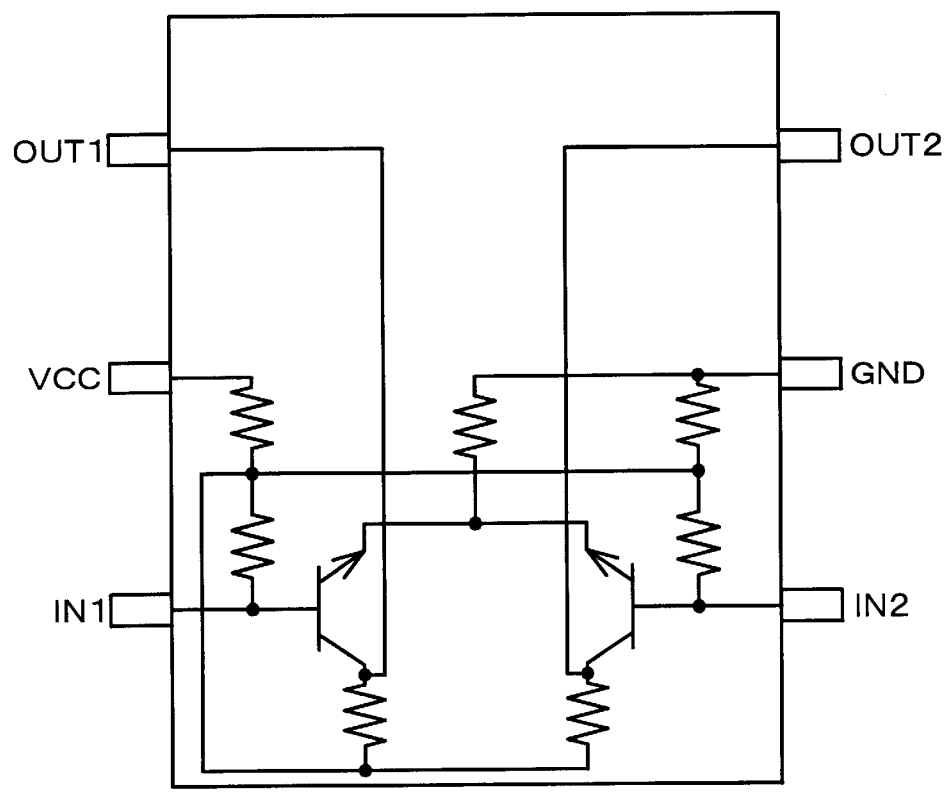
FIG. 8 shows a ping arrangement of μPC2726T of NEC.

FIGS. 1A and 1B show a circuit diagram of an embodiment of the present invention. The circuit denoted by reference numeral 100 in the drawings is applied to a transceiver IC 501 shown in FIG. 5. More concretely, the circuit 100 shown in FIG. 1A corresponds to a high-frequency band low-noise amplifier 502b and the circuit 100 shown in FIG. 1B corresponds to a low-frequency band low-noise amplifier 502a in FIG. 5.

Referring to FIG. 1A, a first unit amplifier 101 has a transistor 102, a bias resistor 103 and a load resistor 105. The amplifier 101 further includes a bias current supply circuit 104 for supplying a bias. Pins of a package are a high-frequency signal input pin IN1 and two ground pins G1 and G2 from an emitter. A second unit amplifier 106 forming a pair with the amplifier 101 has the same construction, and includes a transistor 107, a bias resistor 108 and a load resistor 110. A bias current supply circuit 109 having the same circuit construction to that of the circuit 104 is likewise disposed. Its package has likewise an input pin IN2 and two ground pins G3 and G4. The power supply and the ground pins are a power supply Vcc of the amplifier, a power supply BVcc of the bias circuit and a ground BGND of the bias circuit. A differential amplifier having one ground pin in its unit amplifier has the same circuit construction with the exception that the number of pins becomes smaller.

Next, the operation of the amplifier will be explained. A high-frequency signal is inputted from an antenna 111. A band-pass filter 112 removes out-of-band undesired signals and converts the input signal to differential signals. Matching circuits 113 and 114 of a low-noise amplifier establish impedance matching and send the differential signals to a differential low-noise amplifier inside an IC through the pins IN1 and IN2. Bias circuits 104 and 109 generate bias currents stable to temperature- and power fluctuation, and determine operation points of the transistors 102 and 107. The bias current quantity is equal between the two circuits. The bias resistors 103 and 108 convert the bias currents to voltages. Consequently, suitable bias voltages are supplied to the transistors 102 and 107 and a DC collector current flows, thereby deciding the operation point of each transistor. Each transistor thus performs the amplification operation of the differential input signal. The high-frequency signals so amplified are converted to the voltages by the load resistors 105 and 110 and are sent to a reception mixer 115 of a post stage.

The differential low-noise amplifier having the construction described above employs the pin arrangement tabulated in the lower column of TABLE 1. In other words, the ground pins of the first unit amplifier 101 are so arranged adjacent to the ground pins of the second unit amplifier 106 on the 1:1 basis, respectively. This arrangement reduces the total inductance to about a half of the bonding wire and pin inductance. As a result, mutual conductance Gm of the circuit can be increased as represented by equation 601 and the gain can be improved.

Items Nos. 1 and 2 in TABLE 3 illustrate the result of analysis of circuit characteristics in the ground pin arrangement tabulated in TABLE 1. No. 3 in TABLE 3 represents a modified example of No. 2. Nos. 2 and 3 in TABLE 3 represent the pin arrangement examples in the embodiment of the present invention.

TABLE 3

| No. | Pin Arrangement | | Voltage Gain (dB) | NF (dB) | Input 1 dB Gain Compression Point (dBm) |
|---|---|---|---|---|---|
| 1 | 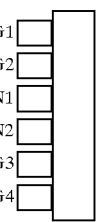 | Ground Pins of One Amplifier Being Adjacent to Each Other (Pin Arrangement a. in TABLE 1) | 15.7 | 1.63 | −4.0 |
| 2 | 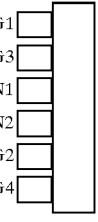 | Ground Pins of Amplifiers Forming Pair Being Adjacent to Each Other (Pin Arrangement b. in TABLE 1) | 17.4 | 1.55 | −6.8 |
| 3 | 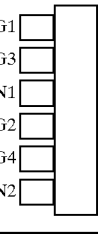 | Ground Pins of Amplifiers Forming Pair Being Adjacent to Each Other | 17.2 | 1.51 | −6.8 |

Next, the circuit shown in FIG. 1B will be explained. Since this circuit is the same as the circuit shown in FIG. 1A with the exception that the ground pin used is one pin, the explanation of its operation will be omitted. The pin arrangement tabulated in the lower column of TABLE 2 is employed in such a circuit. In other words, the ground pin is arranged adjacent to the input pin, and impedance developing in the emitter of the transistor of the amplifier becomes small. As a result, mutual conductance of the circuit and its gain can be improved.

No. 2 in TABLE 4 represents a pin arrangement example in an embodiment of the present invention.

TABLE 4

| No. | Pin Arrangement | | Voltage Gain (dB) | NF (dB) | Input 1 dB Gain Compression Point (dBm) |
|---|---|---|---|---|---|
| 1 |  G2, IN1, IN2, G1 | Input Pins and Ground Pins of Amplifiers Forming Pair Being Adjacent to Each Other (Pin Arrangement a. in TABLE 2) | 16.6 | 1.23 | −4.6 |
| 2 | 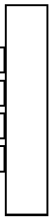 G1, IN1, IN2, G3 | Input Pin and Ground Pin of One Amplifier Being Adjacent to Each Other (Pin Arrangement b. in TABLE 2) | 17.7 | 1.21 | −6.3 |

Figure 2:
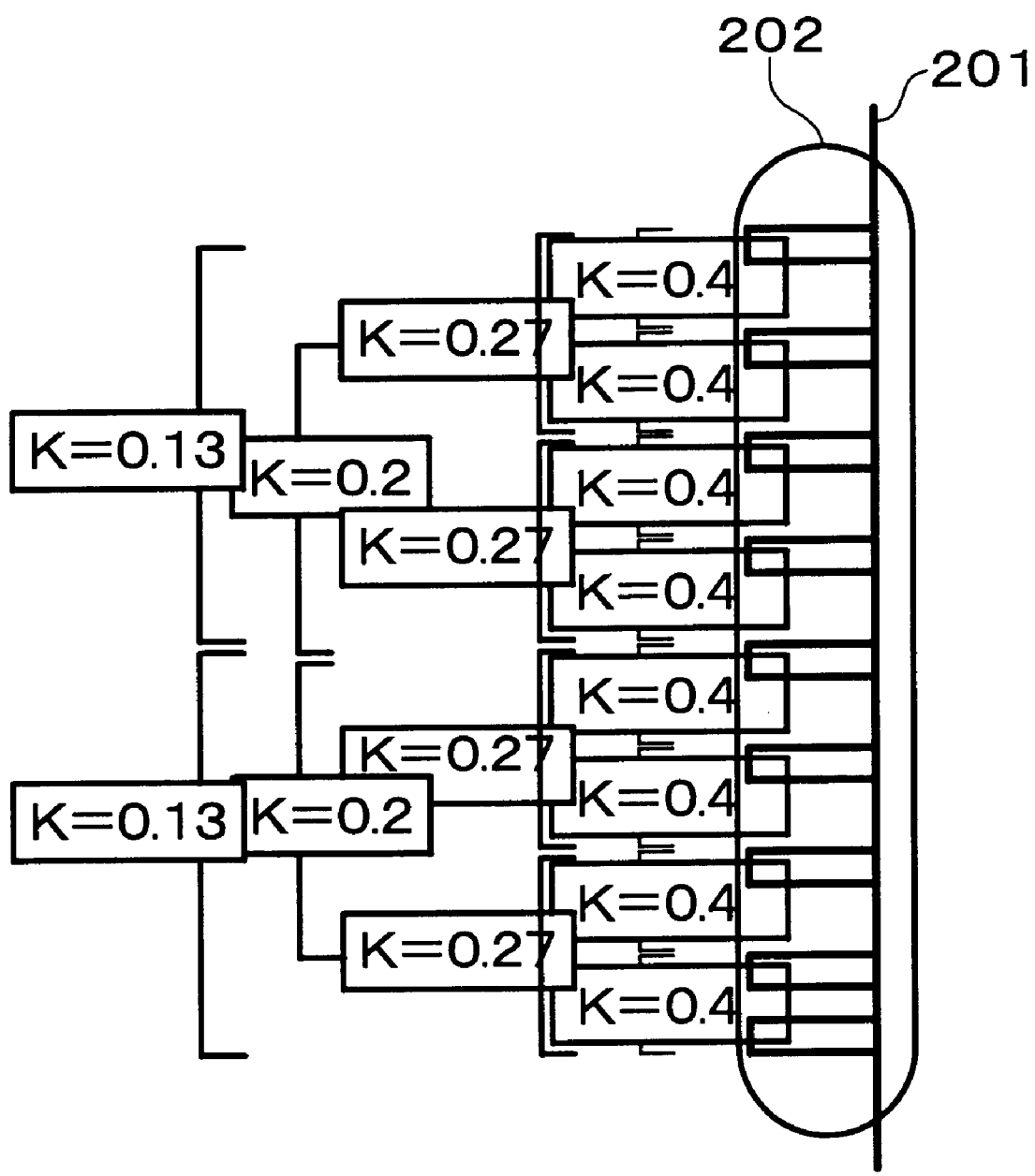
FIG. 2 shows a coupling state between pins of a package.

The circuit analysis tabulated in TABLE 3 and 4 uses a high-frequency simulator HSPICE. A bipolar transistor of a 0.35 μm process is used for the amplifier analyzed. A power supply voltage is 2.8 V, and a DC current of 6 mA is caused to flow through the transistors 102 and 107 to operate them. FIG. 2 shows a coupling state of pins of a part of the package. Reference numeral 201 denotes a part of the package and reference numeral 202 does the pins of the package. Symbol k represents a coupling coefficient that determines the quantity of mutual inductance. It is assumed hereby that mutual inductance operates from a certain pin to the fourth pin and the coupling coefficient is varied to 0.4, 0.27, 0.2 and 0.13 in accordance with the pin distances, respectively. The coupling coefficient is assumed to be one that corresponds to QFP (Quadrature Flat Package) 56 pins. In TABLE 3, the present invention improves the gain by 1.5 to 1.7 dB. In TABLE 4, too, the present invention provides a gain improvement of 1.1 dB.

Figure 3:
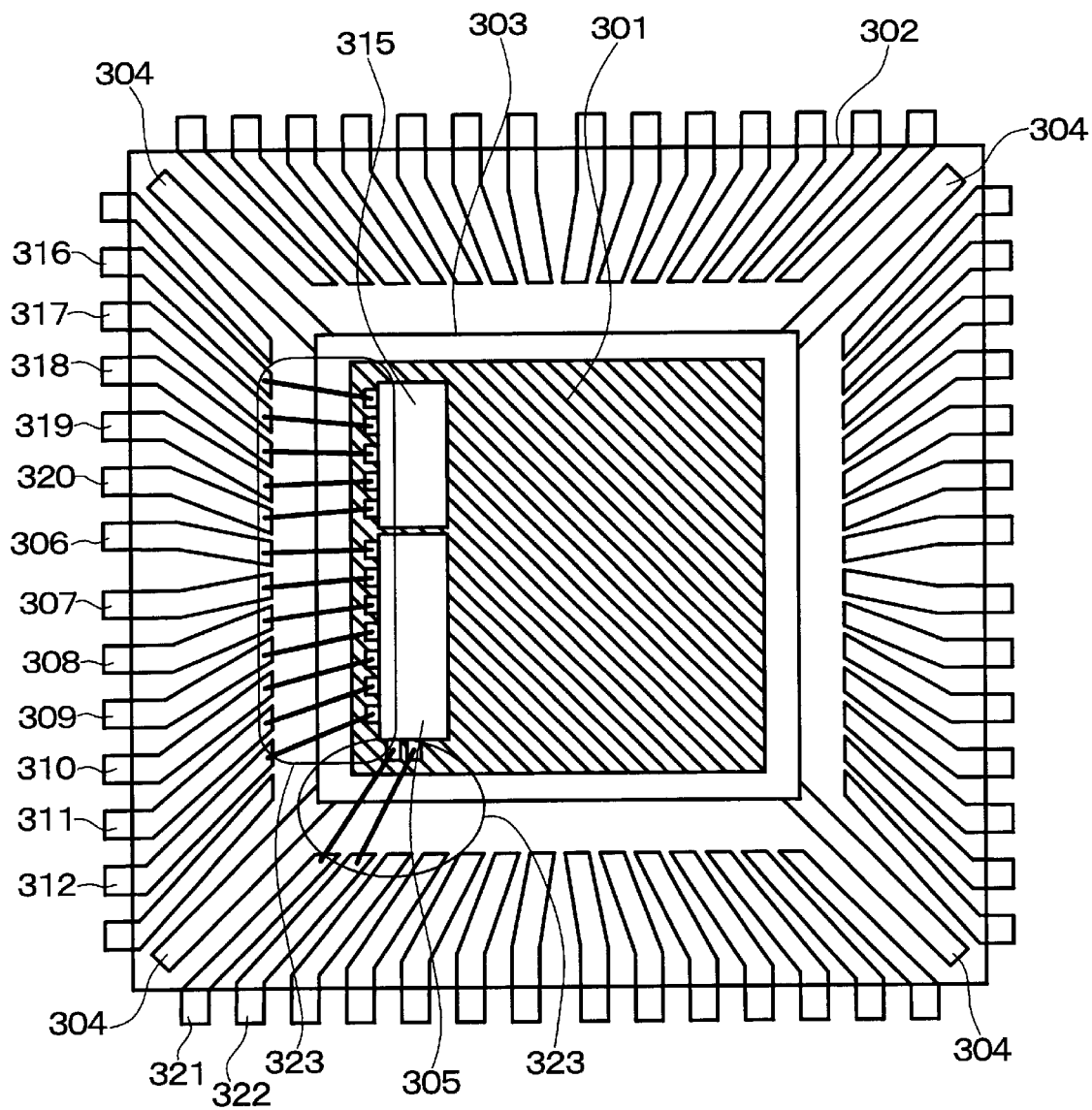
FIG. 3 shows a mounting example of a dual-band transceiver IC to a package according to an embodiment of the present invention.

To reduce the inductance, amplifier layout is preferably made in such a way that the low-noise amplifier circuit be disposed at position at which the distance from the distal end of the pin of the emitter of the amplifier transistor to the pad becomes minimal. FIG. 3 shows an example of such layout. This drawing shows the dual-band transceiver IC described with reference to FIG. 5 by way of example. Reference numeral 301 denotes the transceiver IC chip to which the present invention is applied. Reference numeral 302 denotes QFP56 pins for sealing the transceiver IC. Reference numeral 303 denotes a chip bonding surface of the package. Reference numeral 304 denotes a package support. Reference numeral 305 denotes a layout position of the high-frequency band differential low-noise amplifier 502b according to the present invention. Reference numeral 315 denotes a layout position of the low-frequency band differential low-noise amplifier 502a.

Reference numerals 306 and 310 denote the ground pins of the transistor 102 shown in FIG. 1A. Reference numeral 307 and 311 denote the ground pins of the transistor 107. Reference numerals 308 and 309 denote the input pins of the low-noise differential amplifiers 101 and 106, respectively. Reference numeral 312 denotes the power supply pin of the high-frequency band low-noise amplifier 502b.

In the low-frequency band low-noise amplifier 502a, too, reference numeral 317 denotes the ground pin of the transistor 102 shown in FIG. 1B, reference numeral 320 denotes the ground pin of the transistor 107 and reference numerals 318 and 319 denote the input pins of the low-noise differential amplifiers 101 and 106, respectively. Reference numeral 316 denotes the power supply pin of the low-frequency band low-noise amplifier 502a. Reference numeral 321 denotes the power supply pin of the bias circuit. Reference numeral 322 denotes the ground pin of the bias circuit. The low-frequency low-noise amplifier and the high-frequency low-noise amplifier share the pins of the bias circuit. Reference numeral 323 denotes a bonding wire applied to the lead pin from each pad on the chip.

The amplifiers are arranged near the center of the end face of the chip and are bonded as shown in the drawing. This arrangement reduces the length of the bonding wires between the pads and the pins. Since this embodiment assumes the dual band, the pins of the amplifiers according to the present invention are allocated to the area extending from the center to the lower end. However, the ground pins 306 and 307 are allocated to the pins at the center. Therefore, the inductance component can be reduced much more than when the amplifiers are arranged at the corners of the chip.

Figure 4:
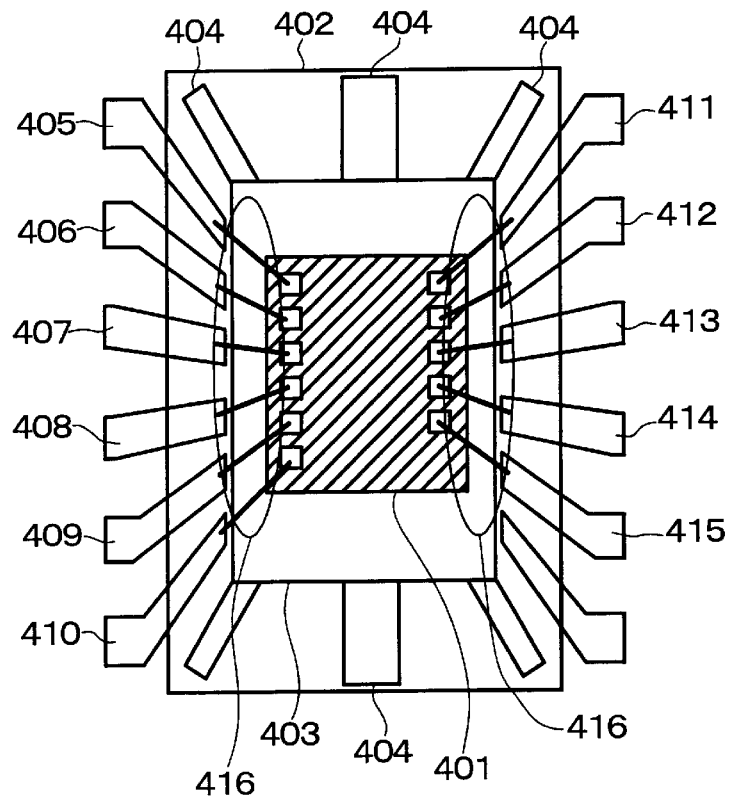
FIG. 4 shows a mounting example of a differential amplifier IC to a package according to an embodiment of the present invention.

The explanation given above represents the LSI having the amplifier. However, the present invention can be applied to an IC comprising only an amplifier. FIG. 4 shows an example of such an IC. Reference numeral 401 denotes a chip of a differential amplifier IC. Reference numeral 402 denotes TSSOP 12 pins of a package sealing the differential amplifier IC. Reference numeral 403 denotes a chip-bonding surface of the package. Reference numeral 404 denotes a package support. Reference numerals 405 and 409 denote ground pins of transistor 102. Reference numerals 406 and 410 denote ground pins of transistors 107. Reference numerals 407 and 408 denotes inputs pins of differential amplifiers 101 and 106. Reference numeral 411 denotes a power supply pin of a bias circuit. Reference numeral 412 denotes a ground pin of a bias circuit. Reference numerals 413 and 414 denote output pins of the differential amplifiers. Reference numeral 415 denotes a power supply pin of the differential amplifiers. Reference numeral 416 denotes a bonding wire put to a lead pin from each pad on the chip.

When the pins are arranged in line symmetry with respect to the package center as shown in the drawing, the distance from the distal end of the pint of the emitter of each amplifier transistor to the pad becomes minimal. This low-noise differential amplifier becomes a complete symmetric circuit inclusive of electrical influences of the package. Therefore, an IC having better differential performance can be expected.

FIGS. 3 and 4 represent the pin arrangement based on No. 2 of TABLE 3, but the pin arrangement may well be based on the pin arrangement shown in No. 3 of TABLE 3.

Though the embodiment deals with the low-noise amplifier by way of example, the present invention pertains to the arrangement of the ground pins of the amplifier. Therefore, the present invention can be applied to versatile amplifiers having the differential construction as shown in FIG. 1A.

In the differential amplifier having two unit amplifiers, the differential amplifier according to this embodiment arranges the ground pins of the first unit amplifier adjacent to the ground pins of the second unit amplifier on the 1:1 basis. In consequence, inductance developing in the emitter of each transistor can be reduced to less than half of that of the single ground pin. As a result, impedance of the emitters of the transistors can be reduced and the gain of the amplifier can be improved. When the unit amplifier has one ground pin, the ground pin of each amplifier is arranged adjacent to the input pin. According to this arrangement, too, impedance can be reduced and the gain can be improved.

To apply the present invention to a large-scale IC such as a transceiver IC, impedance can be further reduced when the layout in which the low-noise amplifier circuits are disposed at the positions at which the distal end of each pin of the emitter of the amplifier transistor to the pad becomes minimal.

In the IC comprising only the differential amplifier, the improvement of the gain and the symmetrical differential amplifiers inclusive of the influences of the package can be achieved by adding the following two constructions to the present invention. First, the low-noise differential amplifier circuits are disposed at the positions at which the distance from the distal end of each pin of the emitter of the amplifier transistor to the pad becomes minimal. Second, a symmetric pin arrangement to the package is employed.

What is claimed is:

1. A semiconductor device including a semiconductor circuit chip, a plurality of lead pins connected to said semiconductor circuit chip and a package sealing said semiconductor circuit chip, said semiconductor circuit chip having formed therein two unit amplifiers, said two unit amplifiers together forming one differential amplifier, wherein:
a first power supply line of a first of said two unit amplifiers is connected to at least two of said plurality of lead pins;
a first power supply line of a second of said two unit amplifiers is connected to at least two of said plurality of lead pins; and
each of said lead pins connected to said first power supply line of said first unit amplifier is arranged adjacent to each of said lead pins connected to said first power source line of said second unit amplifier on the 1:1 basis.

2. A semiconductor device including a semiconductor circuit chip having a differential amplifier, a plurality of lead pins connected to said semiconductor circuit chip and a package sealing said semiconductor circuit chip, wherein:
said differential amplifier has two unit amplifiers together forming a pair;
a first power supply line of each of said unit amplifiers is connected to one of said lead pins; and
said pins connected to said first power supply lines of said two unit amplifiers are arranged adjacent to said lead pins connected to input lines of said unit amplifiers.

3. A semiconductor device according to claim 1, wherein said pins and said input pins connected to said first power supply lines of said two unit amplifiers are arranged in line symmetry from a center of one of the sides of said package.

4. A semiconductor device according to claim 2, wherein said pins and said input pins connected to said first power supply lines of said two unit amplifiers are arranged in line symmetry from a center of one of the sides of said package.

5. A semiconductor device according to claim 1, wherein said two unit amplifiers are arranged at positions on said chip at which a distance from pads connected to said first power supply lines of said two unit amplifiers to the distal end of pins protruding outside said package becomes minimal.

6. A semiconductor device according to claim 2, wherein said two unit amplifiers are arranged at positions on said chip at which a distance from pads connected to said first power supply lines of said two unit amplifiers to the distal end of pins protruding outside said package becomes minimal.

7. A semiconductor device according to claim 3, wherein said two unit amplifiers are arranged at positions on said chip at which a distance from pads connected to said first power supply lines of said two unit amplifiers to the distal end of pins protruding outside said package becomes minimal.

8. A semiconductor device according to claim 4, wherein said two unit amplifiers are arranged at positions on said chip at which a distance from pads connected to said first power supply lines of said two unit amplifiers to the distal end of pins protruding outside said package becomes minimal.

9. A semiconductor device according to claim 1, wherein each of said two unit amplifiers includes a transistor connected to said first power supply line, a second power supply line and a load, said load being connected between said transistor and said second power supply line.

10. A semiconductor device according to claim 2, wherein each of said two unit amplifiers includes a transistor connected to said first power supply line, a second power supply line and a load, said load being connected between said transistor and said second power supply line.

11. A semiconductor device according to claim 3, wherein each of said two unit amplifiers includes a transistor connected to said first power supply line, a second power supply line and a load, said load being connected between said transistor and said second power supply line.

12. A semiconductor device according to claim 4, wherein each of said two unit amplifiers includes a transistor connected to said first power supply line, a second power supply line and a load, said load being connected between said transistor and said second power supply line.

13. A semiconductor device according to claim 5, wherein each of said two unit amplifiers includes a transistor connected to said first power supply line, a second power supply line and a load, said load being connected between said transistor and said second power supply line.

14. A semiconductor device according to claim 6, wherein each of said two unit amplifiers includes a transistor connected to said first power supply line, a second power supply line and a load, said load being connected between said transistor and said second power supply line.

15. A semiconductor device according to claim 7, wherein each of said two unit amplifiers includes a transistor connected to said first power supply line, a second power supply line and a load, said load being connected between said transistor and said second power supply line.

16. A semiconductor device for a wireless transceiver, including a differential low-noise amplifier interposed between a reception mixer for mixing a reception signal from an antenna and a signal from a voltage controlled oscillator, and a plurality of lead pins connected to said differential low-noise amplifier, wherein:

said differential low-noise amplifier has two unit amplifiers to which signals having mutually inverse phases and substantially a same frequency band as one another are inputted; and first power supply lines of said two unit amplifiers are connected to mutually different lead pins.

17. A semiconductor device for a wireless transceiver according to claim 16, wherein said lead pins connected to said first power supply lines of said two unit amplifiers are adjacent to each other.

18. A semiconductor device for a wireless transceiver according to claim 16, wherein said lead pins connected to said first power supply lines of said two unit amplifiers and said lead pins connected to input lines of said unit amplifiers are adjacent to each other.

19. A semiconductor device for a wireless transceiver according to claim 16, wherein said first power supply lines of said two unit amplifiers are connected to a plurality of lead pins, respectively.

20. A semiconductor device for a wireless transceiver according to claim 19, wherein each of said plurality of lead pins connected to said first power supply line of one of said two unit amplifiers is arranged adjacent to each of said plurality of lead pins connected to said first power supply line of the other of said unit amplifiers on the 1:1 basis.

* * * * *